United States Patent
Oberai et al.

(10) Patent No.: US 6,801,143 B2
(45) Date of Patent: Oct. 5, 2004

(54) METHOD AND APPARATUS FOR GENERATING GRAY CODE FOR ANY EVEN COUNT VALUE TO ENABLE EFFICIENT POINTER EXCHANGE MECHANISMS IN ASYNCHRONOUS FIFO'S

(75) Inventors: Ashwani Oberai, Milpitas, CA (US); Kavitha A. Prasad, San Jose, CA (US); Sreenath Kurupati, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 10/186,564

(22) Filed: Jun. 28, 2002

(65) Prior Publication Data

US 2004/0001014 A1 Jan. 1, 2004

(51) Int. Cl.$^7$ ............................................... H03M 7/04
(52) U.S. Cl. ............................. 341/98; 341/96; 341/97
(58) Field of Search ............................ 341/97, 98, 99; 711/217, 200–221

(56) References Cited

U.S. PATENT DOCUMENTS

| | | | | |
|---|---|---|---|---|
| 4,119,961 A | * | 10/1978 | Rockett, Jr. .................. | 341/98 |
| 4,618,849 A | * | 10/1986 | Bruestle ...................... | 341/98 |
| 5,001,497 A | * | 3/1991 | Wills et al. .................... | 347/82 |
| 5,084,841 A | * | 1/1992 | Williams et al. ........ | 365/189.07 |
| 5,450,363 A | * | 9/1995 | Christopherson et al. ..... | 341/98 |
| 5,754,614 A | * | 5/1998 | Wingen ........................ | 377/34 |
| 6,337,893 B1 | * | 1/2002 | Pontius ...................... | 377/108 |

* cited by examiner

Primary Examiner—Michael Tokar
Assistant Examiner—Linh Van Nguyen
(74) Attorney, Agent, or Firm—Blakely, Sokoloff, Taylor & Zafman LLP

(57) ABSTRACT

A method and apparatus for generating Gray code for any even count value to enable efficient pointer exchange mechanisms in asynchronous FIFO's. Allowing Gray code for any range of even count values provides the benefit of decreasing metastability when exchanging pointers for FIFO buffers in asynchronous environments. Utilizing the Gray code adjacency principle, which provides that only one bit changes for any successive numbers, in a larger class of numbers than previously utilized, decreases metastability.

20 Claims, 4 Drawing Sheets

METHOD AND APPARATUS FOR GENERATING GRAY CODE FOR ANY EVEN COUNT VALUE TO ENABLE EFFICIENT POINTER EXCHANGE MECHANISMS IN ASYNCHRONOUS FIFO'S

TECHNICAL FIELD

Embodiments of the invention relate generally to an encoding process and more particularly to a method and apparatus to generate Gray code for any even count value to enable efficient pointer exchange mechanisms in asynchronous First In First Out (FIFO) buffers.

BACKGROUND

In hardware devices requiring data transfer between multiple clock domains, First In First Out (FIFO) buffers are often used to store and retrieve data. This is accomplished by writing the incoming data from one clock domain in the FIFO and then retrieving the data from the other clock domain. In addition to the data transfer across the clock domain boundary, write and read pointers of the FIFO are communicated across these domains to flag FIFO full and empty conditions, as well as other conditions.

A common problem in sending signals across clock domain boundaries is metastablility. Metastability exists when a signal is transitioning between states at the same time it is being sampled. The sampling device expects one of either two states and is not configured to correctly interpret the transitioning signal. Metastability is always a design concern in asynchronous environments.

To minimize metastablility and other error conditions, the FIFO write pointer and read pointer is encoded in Gray code before transmission to the other clock domain. This is done because of the adjacency principle between two successive Gray code values. This is true even when the pointer wraps around, i.e. while going from 7 (Gray code 100) to 0 (Gray code 000) there is only 1 bit change.

The benefits of Gray code counting techniques have long been recognized. Gray code can be described as an encoding of numbers resulting in any two adjacent numbers only differing by one digit. Ascending or descending through a Gray code sequence of numbers results in exactly one digit change, by either adding a new digit or by changing only one existing digit. This is beneficial in computing environments because additional changes introduce opportunity for additional errors.

For example, the first four values of ordinary binary representation are 00, 01, 10, 11. The change from the second number, 01, to the third number, 10, results in 2 digit changes. The 1's placeholder goes from 1 to 0, and the 2's placeholder goes from 0 to 1. These types of changes, as stated above, provide opportunity for error introduction in electromagnetic signaling systems.

The first four values of Gray code representation are 00, 01, 11, and 10. As can be seen in this representation, exactly one digit change exists for each adjacent Gray code representation. This is commonly called the adjacency principle. For any counting sequence, Gray code representation therefore substantially decreases opportunity for error introduction.

One disadvantage to the Gray code counting technique is that it only works when counting a number of values that is a power of 2, e.g. 2 values, 4 values, 8 values, 16 values, etc. For instance, if the same code was used to count 6 values (from 0 to 5), the moment the pointer wrapped around from 5 (Gray code 111) to 0 (Grey Code 000), there would be a 3 bit change. Therefore, the adjaceney principle of Gray code is currently only utilized when the range is a power of 2. This is a common problem in all FIFO's whose depth is not a power of 2.

BRIEF DESCRIPTION OF THE DRAWINGS

Embodiments of the invention are illustrated by way of example, and not necessarily by way of limitation in the figures of the accompanying drawings in which like reference numerals refer to similar elements.

DETAILED DESCRIPTION

A method and apparatus for generating Gray code for any even count value and, more particularly, to a method and apparatus to generate Gray code for any even count value that, for example, may be applied to enable efficient pointer exchange mechanisms in asynchronous First In First Out (FIFO) buffers are disclosed. In this regard, an innovative Gray code generator is introduced to enable the adjacency principles and benefits of Gray code to extend beyond even powers of two, for example if used to pass pointers for a FIFO buffer of an even but non power of two depth.

In the following description numerous specific details are set forth in order to provide a thorough understanding of embodiments of the invention. It will be apparent, however, to one having ordinary skill in the art that the specific detail need not be employed to practice embodiments of the invention. In other instances, well known materials or methods have not been described in detail in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

As was shown above, the benefits of Gray code counting techniques have long been recognized but have only limited application. The utility of the Gray code adjacency principle can be greatly expanded utilizing embodiments of the present invention. What is needed therefore is a method and apparatus to utilize the adjacency principle of Gray code for a range of numbers that is not a power of two, in addition to the power of two numbers for which it is currently used.

One embodiment provides a circuit design that results in an increased application of Gray code. The embodiment provides an increased range, which includes the previous integer power of two values, including as well all other even count values to result in a range of numbers that when converted to Gray code representation result in the adjacency principle applying not only between every value but also between the highest and lowest value.

Figure 1:
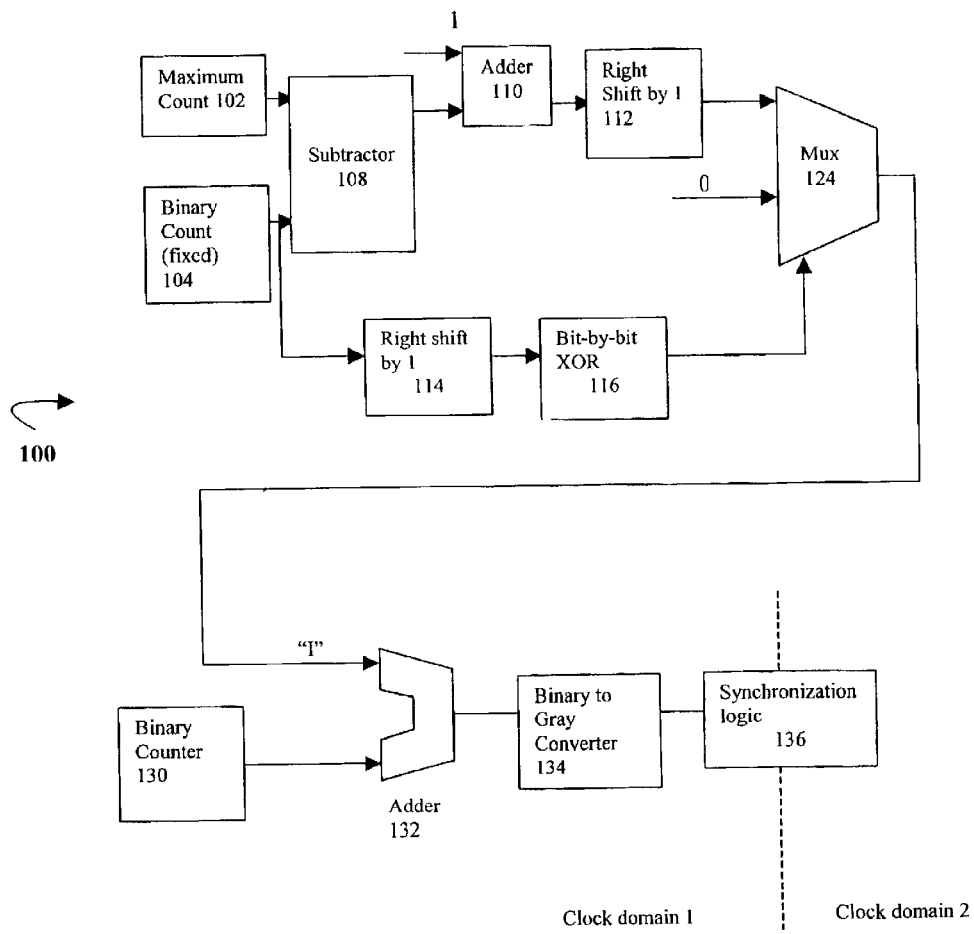
FIG. 1 is an illustration of one embodiment of a circuit for generating Gray code for any even count value to enable efficient pointer exchange mechanisms in asynchronous FIFO's.

In FIG. 1, an embodiment of the present invention is disclosed in circuitry 100. It will be understood by one of ordinary skill in the art that the circuitry as shown is for descriptive purposes only, and that other variations for accomplishing the described aspects of the circuitry may be employed without departing from the principles of or exceeding the scope of the present invention. Specifically, the need for the top elements of the circuit 100 in FIG. 1, including maximum count 102, binary count 104, subtractor 108, adder 110, right shift by 1 register 112, multiplexer (MUX) 124, right shift by 1 register 114 and bit-by-bit XOR 116, may be obviated by replacing them with a hard coded value equal to their output and before the circuit is created.

The binary count 104 is a predetermined value that is dependent upon architecture needs. For example, the circuit 100 is used for generating pointer values for a FIFO buffer in an asynchronous environment, the binary count value would be set to the depth of the FIFO buffer. For instance when the FIFO buffer was 10 registers deep, the binary count value would be fixed at 1010, i.e., the binary representation of 10. In the present usage, maximum count 104 is defined as the maximum value that can be represented by the number of digits in a binary representation of a value. If the binary count 104 value is 1010, as shown above, then the maximum count 104 value would be 1111, or decimal 15.

In this embodiment, a binary count value 104 is input to a subtractor 108. The maximum count 102 is also connected to the subtractor 108. The subtractor 108 subtracts the binary count 104 value from the maximum count 102 and provides this output to an adder 110. In the above example this would result in a value of 1111 minus 1010 resulting in 0101, which is equal to decimal 15–10, or 5.

The adder 110 adds the value from the subtractor to the value 1 and outputs to a right shift by 1 register 112. To continue the example, this results in the addition of 5 and 1 to yield 6, or in binary 0110. The right shift by 1 register 112 effectively divides the value from the adder by 2 and provides its output value to a multiplexer 124. The example number in this instance would be shifted to the right one, resulting in 011, which is decimal 3. The multiplexer 124 has 1 other data input that is hard coded at 0.

The same initial binary count value provided in block 104 also undergoes a test to determine if it is a power of 2. Binary count value 104 is input to a right shift by 1 register 114 and then into a bit-by-bit XOR circuit 116 before the result is the selector value for the multiplexer. The multiplexer 124 therefore will select the output of the right shift by 1 register 112 if the selector value is 0 and the multiplexer 124 will select 0 as its output if the selector value is 1. The example number would result in the binary count 104, in this case 1010, or 10, to be shifted to the right by one digit, resulting in 101. Running 101 though the bit-by-bit XOR circuit 116 results in 0 as the selecting value for the MUX 124. In this case, the selector output by the bit-by-bit XOR 116 would cause the MUX 124 to select the value 011 from the right shift by 1 register 112 instead of the set 0 value on its other input line.

These two elements, right shift by 1 register 114 and bit-by-bit XOR register 116, of the embodiment in FIG. 1 are a way to provide a circuit to account for integer powers of two values that do not require an offset value before conversion to Gray code in order to maintain complete adjacency principle operation.

The output of the MUX 124, the offset value, is also listed in FIG. 1 as the value "I". The portion of the example circuit 100 that generates the "I" value may also be determined in advance, and the "I" value may be hard coded. For example, in embodiments such as FIFO buffers in asynchronous environments, the buffer depth will be known and will often be static hardware, therefore the "I" offset value can be determined in advance and be used as an input to the lower portion of the circuit 100 of the embodiment in FIG. 1. Furthermore, the entire circuit may be implemented in software, including ASICs, CMOS, etc., in which case the circuit may represent a flow chart of the software implementing an embodiment. It will be understood by one of ordinary skill in the art that other means for providing the offset value may be used without exceeding or departing from the scope of the present invention, such as equivalent circuits or as a hard coded value or even as a value that was calculated at least in part using software.

In FIG. 1, on the lower portion of the embodiment circuit 100, the "I" offset value and a binary counter's 130 values are inputs to an adder 132. The adder 132 outputs the result to a binary to Gray converter 134. The output from the binary to Gray converter is the shifted value that provides complete adjacency principle operation for any even count range of numbers. To continue the above example, the "I" offset is selected at 3, or in binary 011, when the buffer depth is 10. The binary counter 130 would then output a range of 10 values, from 0 to 9, or in binary from 0000 to 1001. Each of these values is added to the "I" value, in this example binary 011, to result in a shifted binary set of numbers with a range of 10 values. The shifted values may be used in additional processing, for example, in Synchronization logic 136 as pointers for FIFO buffers in an asynchronous environment.

Figure 2:
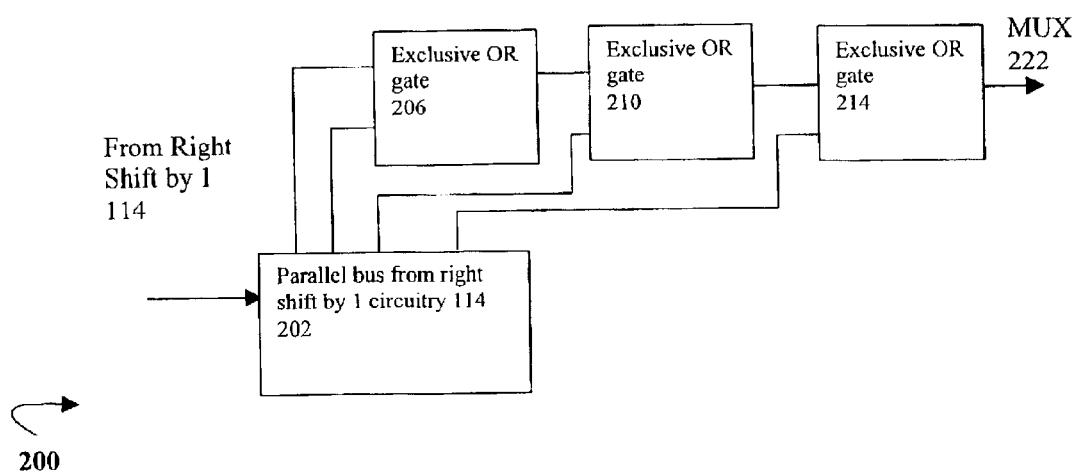
FIG. 2 is an illustration of one embodiment of a circuit for conducting a bit-by-bit exclusive OR (XOR) as shown as the functional block labeled bit-by-bit XOR of the embodiment circuit in FIG. 1.

In FIG. 2, an embodiment 200 of the bit-by-bit XOR 116 circuit portion of the embodiment in FIG. 1 is shown. A bit-by-bit XOR may be implemented by connecting the parallel bus 202 to a series of XOR gates. The XOR gates are connected in a fashion where the left most two bits from the parallel bus 202 are XORed first in Exclusive OR gate 206. The result of this Exclusive OR operation is XORed with the third leftmost bit from the parallel bus 202 in Exclusive OR gate 210. The result of Exclusive OR gate 210 is XORed with the fourth leftmost bit from the parallel bus 202 in Exclusive OR gate 214.

The bit-by-bit XOR may be implemented on any data width and need not be restricted to the 4 bit wide example of the embodiment 200 in FIG. 2. Greater or fewer XOR gates may be added or subtracted such that they are sufficient to XOR in the fashion shown above for the entire data set provided by the parallel bus 202. It will be understood by one of ordinary skill in the art that the bit-by-bit XOR circuit 200 shown in FIG. 2 may be implemented using different types or arrangements of gates without departing from the scope of the present invention.

Figure 3:
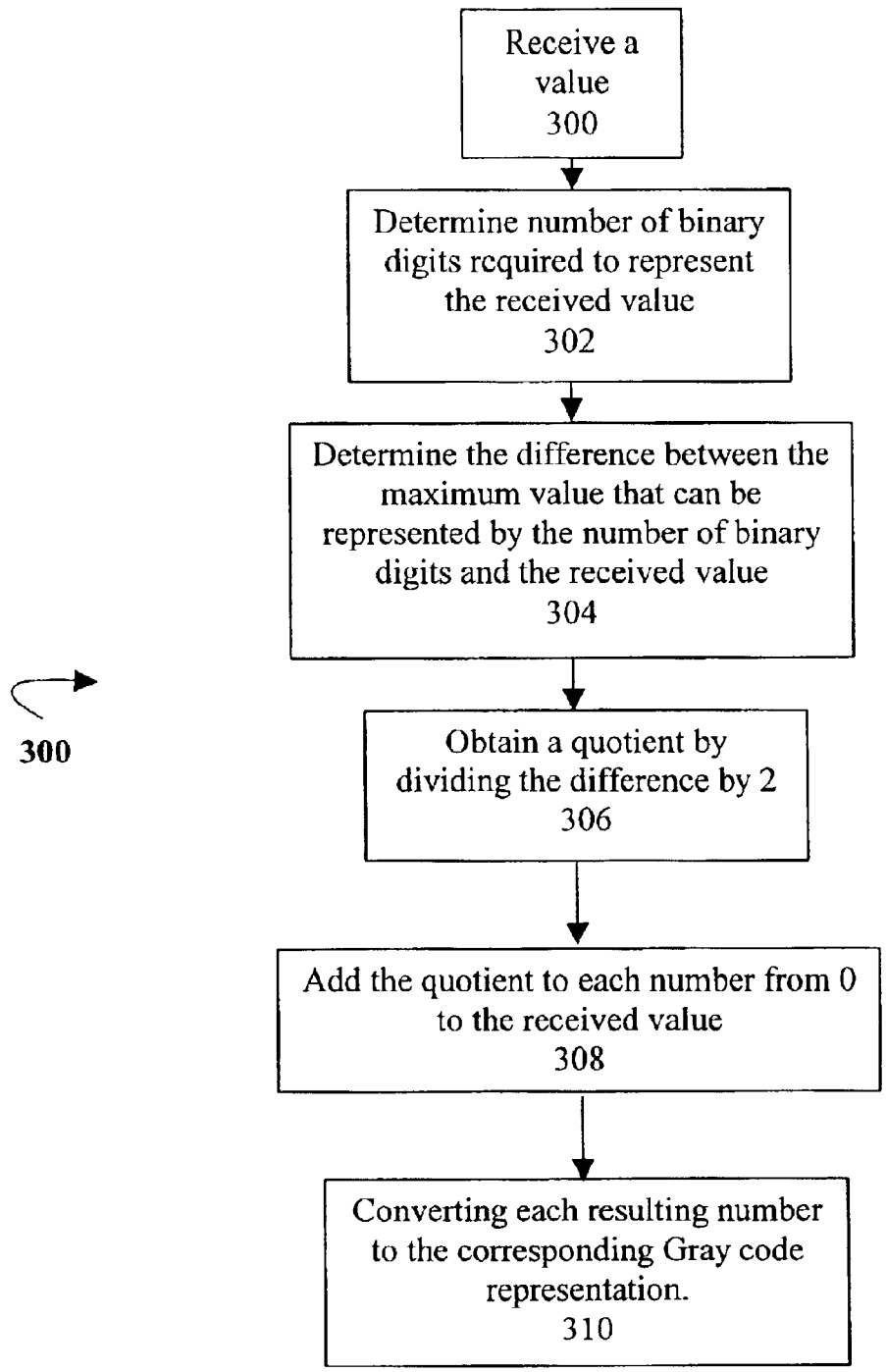
FIG. 3 is a flowchart illustrating one embodiment of a method for generating Gray code for any even count value to enable efficient pointer exchange mechanisms in asynchronous FIFO's.

It will be understood by one of ordinary skill in the art would be to create other flowcharts illustrating how to implement other embodiments of the present invention that enable use of the adjacency principle of Gray code over any even count range of values. Turning now to FIG. 3, the particular methods of the invention are described in terms of computer software with reference to a flowchart 300. The methods to be performed by a computer constitute computer programs made up of computer-executable instructions.

Describing the methods by reference to a flow diagram enables one skilled in the art to develop such programs including such instructions to carry out the methods on suitably configured computers (i.e., the processor or processors of the computer executing the instructions from computer-accessible media). The computer-executable instructions may be written in a computer programming language or may be embodied in firmware logic. If written in a programming language conforming to a recognized standard, such instructions can be executed on a variety of hardware platforms and for interface to a variety of operating systems or without an operating system.

FIG. 3 is a flow chart 300 illustrating one embodiment of a process for generating Gray code for non integer powers of 2 even numbers. At block 300 circuit 100 receives a value. At block 302 circuit 100 determines the number of binary digits to represent the received value. At block 304 the result of block 302 is compared to the maximum count 102 that may be represented by the number of binary digits of the received value, and a difference is determined. In block 306 circuit 100 divides the difference from block 304 by 2, thus obtaining a quotient. In block 308, the quotient is added to each value in a range from 0 to the received value. In block 310, the circuit 100 converts the result of block 308 to corresponding Gray code representation.

Figure 4:
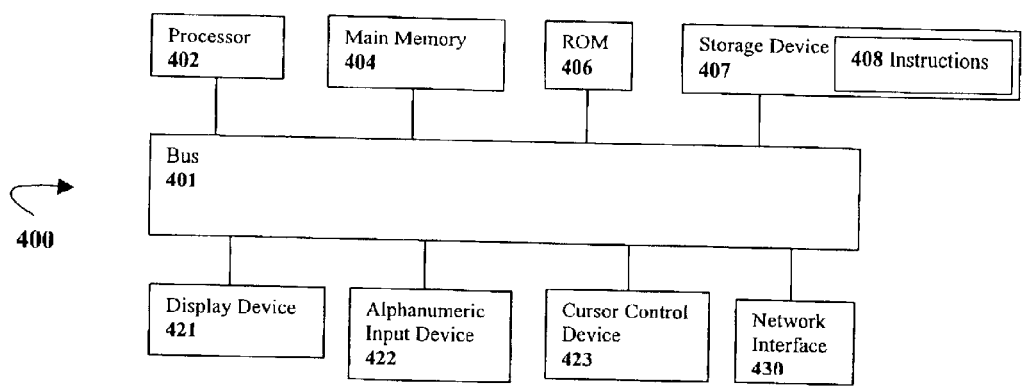
FIG. 4 is an illustration of one embodiment of a computing system capable of generating Gray code for any even count value to enable efficient pointer exchange mechanisms in asynchronous FIFO's.

FIG. 4 is a block diagram of one embodiment 400 of a computer system. Referring to FIG. 4, one embodiment 400 may be a networking device, or other computing system that operates as a router, server or hub or any other node in a computer network exchanging signals between any other network elements. The computer system illustrated in FIG. 4 is intended to represent a range of computer systems. Alternative computer systems can include more, fewer and/ or different components.

Computer system 400 includes bus 401 or other communication device to communicate or transmit information, and processor 402 coupled to bus 401 to process information. Processor 402 may include semiconducting processors generally, ASICs, PLDs, FPGAs, DSPs, embedded processors, chipsets, or any other processing device. While computer system 400 is illustrated with a single processor, computer system 400 can include multiple processors and/or co-processors. Computer system 400 further includes random access memory (RAM) or other dynamic storage device 404 (referred to as main memory), coupled to bus 401 to store information and instructions to be executed by processor 402. Main memory 404 also can be used to store temporary variables or other intermediate information during execution of instructions by processor 402.

Computer system 400 also includes read only memory (ROM) and/or other static storage device 406 coupled to bus 401 to store static information and instructions for processor 402. Data storage device 407 is coupled to bus 401 to store information and instructions. Data storage device 407 such as a magnetic disk or optical disc and corresponding drive can be coupled to computer system 400.

Computer system 400 can also be coupled via bus 401 to display device 421, such as a cathode ray tube (CRT) or liquid crystal display (LCD), to display information to a computer user. Alphanumeric input device 422, including alphanumeric and other keys, is typically coupled to bus 401 to communicate information and command selections to processor 402. Another type of user input device is cursor control 423, such as a mouse, a trackball, or cursor direction keys to communicate direction information and command selections to processor 402 and to control cursor movement on display 421. Computer system 400 further includes network interface 430 to provide access to a network, such as a local area network.

Instructions are provided to memory from a storage device, such as magnetic disk, a read-only memory (ROM) integrated circuit, CD-ROM, DVD, via a remote connection (e.g., over a network via network interface 430) that is either wired or wireless, etc. In alternative embodiments, hard-wired circuitry can be used in place of or in combination with software instructions to implement embodiments of the invention. Thus, the present invention is not limited to any specific combination of hardware circuitry and software instructions.

The apparatus may be specially constructed for the required purposes, or may comprise a general-purpose computer selectively activated or reconfigured by a computer program stored in a computer. Such a computer program may be stored in a machine-readable storage medium, such as, but not limited to, any type of magnetic or other disk storage media including floppy disks, optical storage media, CD-ROMs, and magnetic-optical disks, read-only memories (ROMs), random access memories (RAMs), EPROMs, EEPROMs, Flash memory, magnetic or optical cards; electrical, optical, acoustical or other form of propagated signals (e.g., carrier waves, infrared signals, digital signals, etc.), or any type of media suitable for storing electronic instructions, and each coupled to a computer system bus.

In one embodiment a storage medium 407 including executable content or instructions 408 is connected to control logic in the processor 402 to selectively access and execute the content 408 to implement generation of Gray code values for any even count range of values, an example application being used as pointers for FIFO buffers in an asynchronous environment, such that the pointers maintain the adjacency principles of Gray code between all values included when wrapping from the highest value in the range to the lowest value. It will be understood by one of ordinary skill in the art how to configure a Gray code generation circuit or program to implement the creation of this range of values that benefit from the adjacency principle.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the embodiments described herein, as well as alternative arrangements, may be devised by those skilled in the art without departing from the spirit of the present invention and the scope of the appended claims.

What is claimed is:

1. A method for generating Gray code comprising:

receiving a value;

determining a number of binary digits to represent the received value;

determining a difference between a maximum value that can be represented by the number of binary digits and the received value;

obtaining a quotient by dividing the difference by 2;

adding the quotient to each number from 0 to the received value; and converting each resulting number to the corresponding Gray code representation.

2. The method of claim 1 further comprising determining that the received value is not an integer power of 2.

3. The method of claim 1 wherein the received value is even.

4. A circuit for generating Gray code comprising:
   a binary counter to provide a binary count;
   a circuit providing an offset value to equal one half the difference of a received value and a maximum value that can be represented by a number of digits in a binary representation of the received value;
   an adder coupled with the binary counter and the circuit to add the binary count and the offset values; and
   a binary to Gray converter coupled with the adder, to convert the added values to a corresponding Gray code representation.

5. The circuit of claim 4, wherein the received value is not an integer power of 2.

6. The circuit of claim 4, wherein the corresponding Gray code representation is to generate pointer values for a buffer between multiple clock domains.

7. The circuit of claim 6, wherein the buffer is a first in first out (FIFO) buffer.

8. A circuit for generating Gray code comprising:
   a means to provide a binary count;
   a means to provide an offset value to equal one half the difference of a received value and a maximum value that can be represented by a number of digits in a binary representation of the received value;
   an adder coupled with the binary count means and the offset value means to add the binary count and the offset values; and
   a binary to Gray converter coupled to the adder, to convert the added values to a corresponding Gray code representation.

9. The circuit of claim 8, further comprising means for generating pointer value from the corresponding Gray code representation for a buffer between multiple clock domains.

10. The circuit of claim 9 wherein the buffer is a first in first out (FIFO) buffer.

11. A circuit for generating a Gray code offset value comprising:
   a binary counter to provide a binary count value;
   a maximum value that can be represented by the number of binary digits in the binary count value;
   a subtracter to subtract the binary count value from the maximum value to result in a difference value;
   and adder, coupled to the output of the subtractor, to add the difference value with the value 1 to result in an added value;
   a first right shift circuitry coupled to the output of the adder, to shift a binary representation of the added value to the right by 1, effectively dividing it by 2, to result in a first shifted value;
   a second right shift circuitry coupled to the output of the binary counter to shift the binary count value to the right by 1, effectively dividing it by 2, to result in a second shifted value;
   a bit-by-bit exclusive OR (XOR) circuitry connected to the output of the second right shift circuitry, to XOR the digits of the second shifted value in sequential blocks of 2 from the most significant bit to the least significant bit to result in a selector value; and
   a multiplexer with two inputs and connected to the exclusive OR circuitry, one input connecting to the first right shift circuitry and providing the first shifted value, and a second input being set at 0, the multiplexer to output the first shifted value when the selector value is 0 and 0 when the selector value is 1.

12. The circuit of claim 11 further comprising an adder coupled with the binary counter and the output from the multiplexer to add their values.

13. The circuit of claim 12 further comprising a binary to Gray converter coupled to the adder to convert the added values to the corresponding Gray code representation.

14. The circuit of claim 13 wherein it is used at least in part to exchange pointers for a FIFO between multiple clock domains.

15. The circuit of claim 13 coupled with synchronization logic at a clock domain boundary.

16. The circuit of claim 15 further comprising a gray to binary converter coupled with the synchronization logic.

17. The circuit of claim 16 further comprising a subtractor coupled to the gray to binary converter to subtract the input and thus provide the binary value received from the binary counter.

18. A machine-readable medium having stored thereon data representing sequences of instructions which, when executed by a processor, cause the processor to perform operations comprising:
   receiving a value;
   determining a number of binary digits to represent the received value;
   determining a difference between a maximum value that can be represented by the number of binary digits and the received value;
   obtaining a quotient by dividing the difference by 2;
   adding the quotient to each number from 0 to the received value; and
   converting each resulting number to a corresponding Gray code representation.

19. The medium of claim 18 further comprising instructions that when executed by the processor cause the processor to determine that the received value is not an integer power of 2.

20. The medium of claim 18 wherein the corresponding Gray code representation is a pointer for a buffer.

* * * * *

UNITED STATES PATENT AND TRADEMARK OFFICE
CERTIFICATE OF CORRECTION

PATENT NO. : 6,801,143 B2
DATED : October 5, 2004
INVENTOR(S) : Oberai et al.

It is certified that error appears in the above-identified patent and that said Letters Patent is hereby corrected as shown below:

Column 2,
Line 3, delete "adjaceney" and insert -- adjacency --.

Signed and Sealed this

Twenty-fourth Day of May, 2005

JON W. DUDAS
*Director of the United States Patent and Trademark Office*